(12) United States Patent
Wang et al.

(10) Patent No.: US 8,174,275 B2
(45) Date of Patent: May 8, 2012

(54) STORAGE BATTERY INSPECTING SYSTEM

(75) Inventors: Kuen-Cheng Wang, Taichung (TW);
Tsair-Rong Chen, Changhua County (TW); Jeen-Sheen Row, Miaoli (TW)

(73) Assignees: Kuen-Cheng Wang, Taichung (TW); The Dept. of Electrical Engineering, National Chang-Hua University of Education, Changhua (TW)

( * ) Notice: Subject to any disclaimer, the term of this patent is extended or adjusted under 35 U.S.C. 154(b) by 458 days.

(21) Appl. No.: 12/565,645

(22) Filed: Sep. 23, 2009

(65) Prior Publication Data
US 2010/0013492 A1 Jan. 21, 2010

Related U.S. Application Data

(63) Continuation-in-part of application No. 11/960,492, filed on Dec. 19, 2007, now abandoned.

(51) Int. Cl.
*G01R 27/08* (2006.01)
*G01R 31/08* (2006.01)
(52) U.S. Cl. .................. 324/713; 324/525; 324/522
(58) Field of Classification Search .................. 324/522, 324/525, 713
See application file for complete search history.

(56) References Cited

U.S. PATENT DOCUMENTS

| | | | |
|---|---|---|---|
| 4,639,569 A * | 1/1987 | Dufrenne | 219/109 |
| 4,963,830 A | 10/1990 | Roth et al. | 324/715 |
| 5,073,758 A | 12/1991 | Postlewait et al. | 324/713 |
| 6,787,935 B2 | 9/2004 | Heim | 307/10.1 |
| 6,924,625 B2 * | 8/2005 | Teraoka et al. | 320/150 |
| 2007/0221627 A1 * | 9/2007 | Yugou et al. | 218/136 |

* cited by examiner

*Primary Examiner* — Amy He
(74) *Attorney, Agent, or Firm* — Ladas & Parry, LLP

(57) ABSTRACT

A storage battery inspecting system includes a power supply unit and an inspecting unit. The inspecting unit includes two inspecting terminals to be connected to a battery soldering spot so as to detect response of the soldering spot to application of a test power signal by the power supply unit, and a control module for determining if a detected response of the soldering spot falls within a predetermined range configured in the control module, generating an indication signal if the detected response falls outside the predetermined range, and generating an inspection result corresponding to the detected response. The inspecting unit further includes an indication interface for outputting the indication signal, a transmission interface permitting supply of the inspection result to a processing device, and a control interface permitting supply of a control signal generated by the control module to a peripheral device for controlling operation of the peripheral device based on the detected response.

8 Claims, 3 Drawing Sheets

STORAGE BATTERY INSPECTING SYSTEM

CROSS-REFERENCE TO RELATED APPLICATION

This application is a continuation-in-part (CIP) of U.S. patent application Ser. No. 11/960,492, filed on Dec. 19, 2007, which is incorporated herein by reference.

BACKGROUND OF THE INVENTION

1. Field of the Invention

The invention relates to a storage battery inspecting system, more particularly to a system for inspecting soldering spots in a batch of storage batteries on a battery inspection line.

2. Description of the Related Art

A storage battery generally includes a plurality of electrode plates, which are immersed in an electrolytic solution and which are interconnected in series. The series connections among the electrode plates are accomplished by soldering adjacent pairs of soldering lugs of the electrode plates of the storage battery. If the soldering spots are not firm, failure of the series connections is likely to occur. Moreover, in case there is air trapped in a soldering spot, breaking of the soldering spot is likely to occur when a large electric current passes therethrough, such as when a car engine is started. Therefore, there is a need to find ways to determine the quality of soldering spots so as to ensure the quality of a storage battery product.

U.S. Pat. No. 6,787,935B2 discloses a conventional battery sensor device to be fastened to a battery pole and having a first voltage tap connected to the battery pole through a first resistance connection, a second voltage tap connected to another battery pole through a cable and a connector, and a second resistance connection connected to a vehicle body mass through a connection cable. An electronic unit is fastened to the resistance connections by way of soldering points, and is configured to measure the battery voltages at the first and second voltage taps, the voltage between the two soldering points, and the battery temperature through a temperature sensor.

It is noted that the aforesaid battery sensor device is not configured for detecting states of individual soldering spots in a batch of storage batteries on a battery inspection line.

U.S. Pat. No. 5,073,758 discloses another conventional device for measuring the resistance of a soldering tip. This conventional device includes a generating circuit for providing an a.c. signal which passes through the soldering tip, and which is then converted to a d.c. signal proportional to the resistance of the soldering tip. The conventional device disclosed therein is likewise not configured for detecting states of individual soldering spots in a batch of storage batteries on a battery inspection line.

SUMMARY OF THE INVENTION

Therefore, the object of the present invention is to provide a system for inspecting a soldering spot in a storage battery, which can provide an inspection result based on a detected response to a processing device, and which can generate an indication signal if the detected response falls outside a predetermined range.

Accordingly, a system of the present invention is for inspecting a soldering spot that interconnects electrically soldering lugs on an adjacent pair of electrode plates of a storage battery. The system comprises a housing, a power supply unit, and an inspecting unit. The power supply unit is disposed in the housing for outputting a test power signal to be applied across opposite end portions of the soldering spot. The inspecting unit is disposed in the housing, and includes first and second inspecting terminals, a control module, an indication interface, a transmission interface, and a control interface. The first and second inspecting terminals are adapted to be connected electrically and respectively to the opposite end portions of the soldering spot so as to detect response of the soldering spot to application of the test power signal by the power supply unit. The control module is for determining if a detected response of the soldering spot as detected through the first and second inspecting terminals falls within a predetermined range configured in the control module, for generating an indication signal and a control signal if the detected response falls outside the predetermined range, and for generating an inspection result corresponding to the detected response. The indication interface is coupled to the control module to output the indication signal. The transmission interface is coupled to the control module to permit supply of the inspection result to a processing device. The control interface is to permit supply of a control signal generated by the control module to a peripheral device for controlling operation of the peripheral device based on the detected response.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
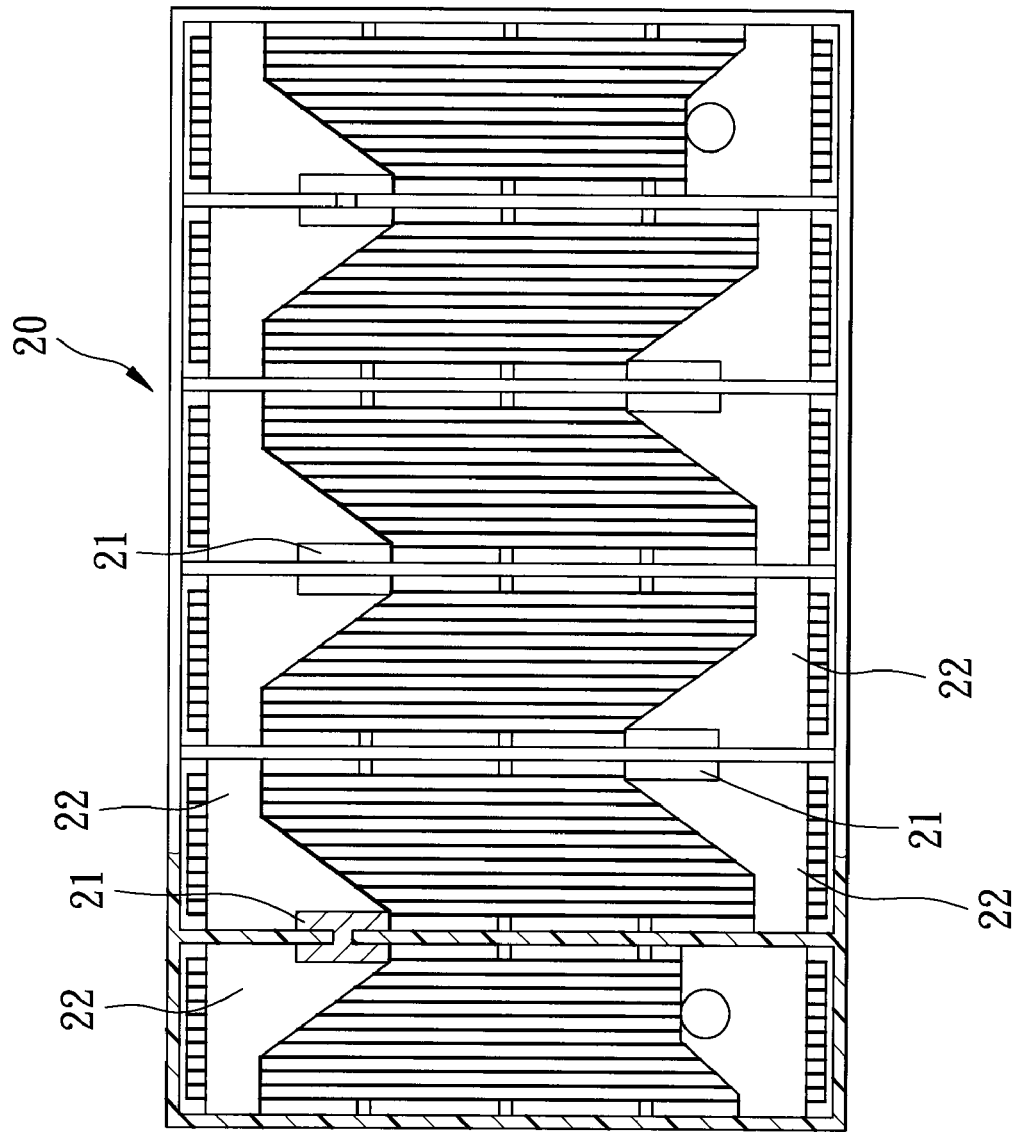
FIG. 1 is a schematic sectional view of a conventional storage battery to be inspected by the system according to the present invention.
Figure 2:
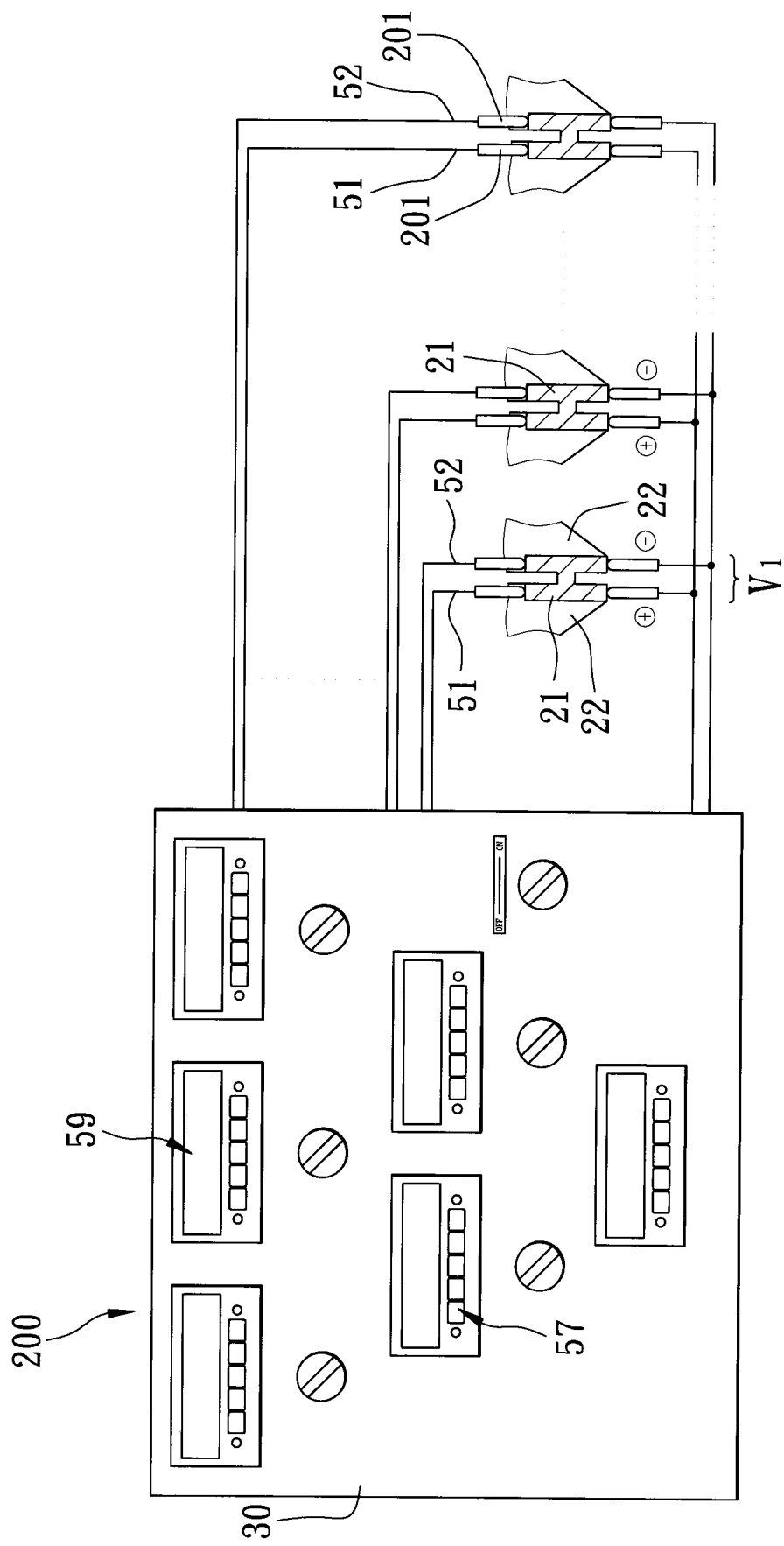
FIG. 2 is a schematic view of the preferred embodiment of a system for inspecting a soldering spot in a storage battery according to the present invention.
Figure 3:
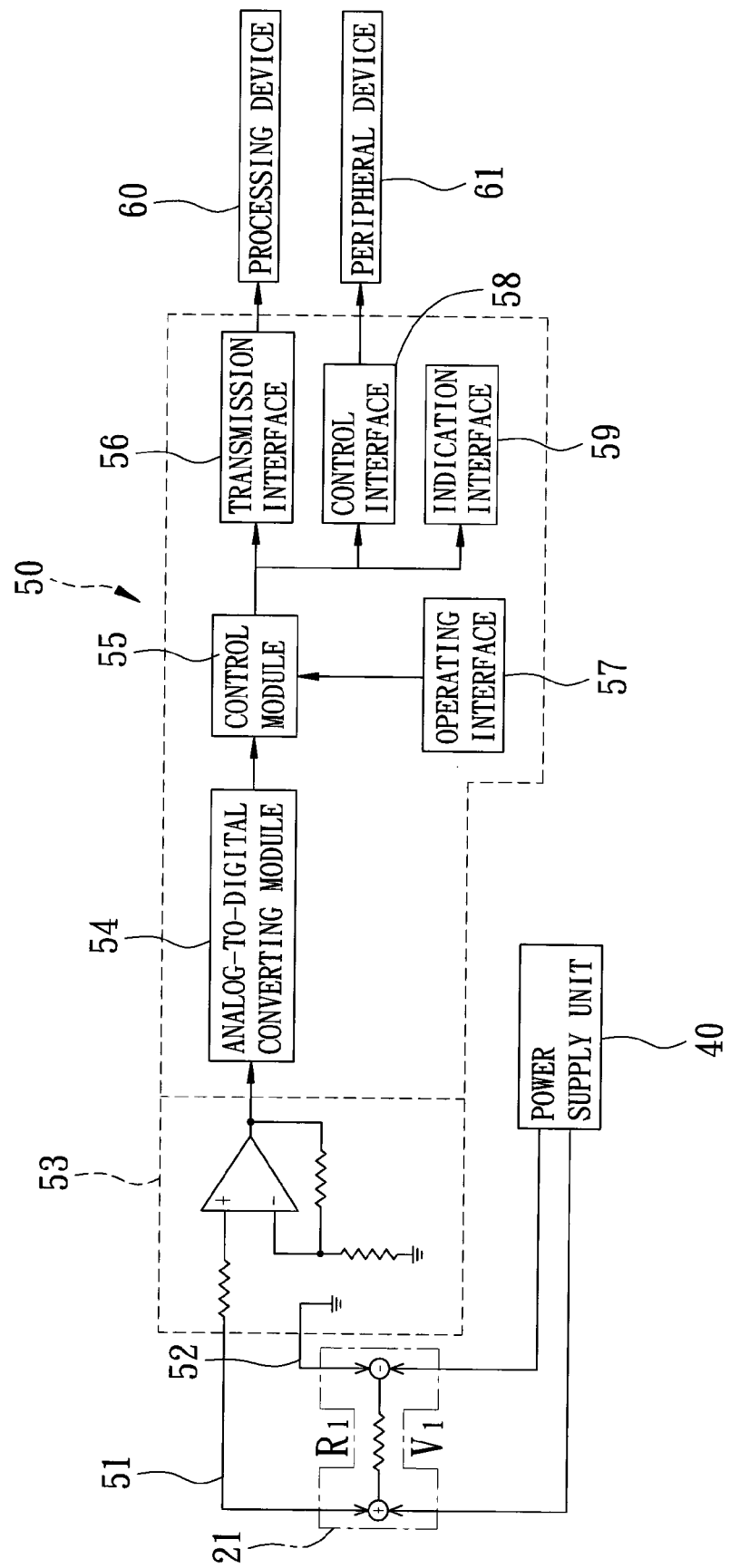
FIG. 3 is a schematic block diagram of the preferred embodiment.

Referring to FIGS. 1 to 3, the preferred embodiment of a system 200 according to the present invention is adapted for inspecting soldering spots 21 in a batch of storage batteries 20 on a battery inspection line. Each soldering spot 21 interconnects electrically soldering lugs 22 on adjacent pairs of electrode plates (not shown) of each storage battery 20. The system 200 comprises a housing 30, a power supply 40, and an inspecting unit 50. In this embodiment, the system 200 is used to inspect five soldering spots 21 in each storage battery 20.

The power supply unit 40 is disposed in the housing 30 and is operable to output test power signals ($V_1$) to be applied across opposite end portions of the soldering spots 21, respectively.

The inspecting unit 50 is disposed in the housing 30, and includes a plurality of first inspecting terminals 51, a plurality of second inspecting terminals 52, an input module 53 coupled to the first and second inspecting terminals 51, 52, an analog-to-digital converting module 54 coupled to the input module 53, a control module 55 coupled to the analog-to-digital converting module 54 and configured with a predetermined range, a transmission interface 56 coupled to the control module 55, an operating interface 57 coupled to the control module 55, a control interface 58 coupled to the control module 55, an indication interface 59 coupled to the control module 55, a processing device 60 coupled to the transmission interface 56, and a peripheral device 61 coupled to the control interface 58.

Each pair of the first and second inspecting terminals 51, 52 are to be coupled electrically and respectively to the opposite end portions of a corresponding one of the soldering spots 21 of each storage battery 20. In practice, the first and second inspecting terminals 51, 52 and the power supply unit 40 are coupled to the soldering spots 21 with the use of contact probes 201.

The input module 53 includes a buffer circuit built from an operational amplifier. FIG. 3 shows one buffer circuit to correspond with a pair of the first and second inspecting terminals 51, 52. In practice, there are a plurality of buffer circuits to correspond with the plurality of pairs of the first and second inspecting terminals 51, 52.

The control module 55 determines if a detected response of each of the soldering spots 21 as detected through the corresponding pair of the first and second inspecting terminals 51, 52 falls within the predetermined range configured in the control module 55, generates an indication signal and a control signal if the detected response falls outside the predetermined range, and generates an inspection result corresponding to the detected response. In this embodiment, the predetermined range is a resistance range.

The transmission interface 56 permits supply of the inspection results to the processing device 60, which is responsible for storing, analyzing and computing the same. In this embodiment, the processing device 60 is a computer. The results of analysis and computations made by the processing device 60 can be subsequently used to evaluate the quality of a batch of storage battery products.

The operating interface 57 permits configuring of the predetermined range, i.e., the resistance range, in the control module 55.

The control interface 58 permits supply of the control signal generated by the control module 55 to the peripheral device 61 for controlling operation of the peripheral device 61 based on the detected responses. As an example, the peripheral device 61 can be a transmission device provided with a programmable logic controller (PLC) to control movements of the probes 201 and the storage batteries 20. The peripheral device 61 receives the control signal and is responsive to the control signal to move a defective one of the storage batteries 20 associated with the control signal away from the battery inspection line, thereby achieving an automated inspection effect.

The indication interface 59 is for providing a visual indication of the inspection results, and is disposed for outputting the indication signal from the control module 55.

When inspecting one storage battery 20, the first and second inspecting terminals 51, 52 are coupled to the soldering spots 21 in pairs with the use of the probes 201 to apply the test power signals ($V_1$) to the soldering spots 21, respectively. Since each soldering spot 21 has a small resistance ($R_1$), the electric currents flowing through the soldering spots 21 as a result of application of the test power signals ($V_1$) can be converted by the input module 53 into corresponding voltages, which are subsequently converted by the analog-to-digital converting module 54 into digital signals that are provided to the control module 55. The control module 55 converts the digital signals into resistance values corresponding to the soldering spots 21. If the resistance value of any of the soldering spots 21 falls outside the predetermined range configured in the control module 55, the soldering spot 21 is determined to be a poor connection that needs to be re-soldered.

Since inspection of the soldering spots 21 is conducted by the inspecting unit 50 using electrical signals, the quality of the soldering spots 21 can be accurately determined. Furthermore, by outputting the inspection results through the transmission interface 56, the inspection results can be stored for future evaluation of the quality of a batch of storage battery products.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A system for inspecting a soldering spot in a storage battery, the soldering spot interconnecting electrically soldering lugs on an adjacent pair of electrode plates of the storage battery, said system comprising:
   a housing;
   a power supply unit disposed in said housing for outputting a test power signal to be applied across opposite end portions of the soldering spot; and
   an inspecting unit disposed in said housing and including
       first and second inspecting terminals adapted to be connected electrically and respectively to the opposite end positions of the soldering spot so as to detect response of the soldering spot to application of the test power signal by said power supply unit,
       a control module for determining a control signal if a detected response of the soldering spot as detected through said first and second inspecting terminals falls with in a predetermined range configured in said control module, for generating an indication signal if the detected response falls outside the predetermined range, and for generating an inspection result corresponding to the detected response,
       an indication interface coupled to said control module to output the indication signal,
       a transmission interface coupled to said control module to permit supply of the inspection result to a processing device, and
       a control interface to permit supply of the control signal generated by said control module to a peripheral device for controlling operation of the peripheral device based on the detected response.

2. The system as claimed in claim 1, wherein said inspecting unit further includes an input module coupled to said first and second inspecting terminals, an analog-to-digital converting module coupled between said input module and said control module, and an operating interface coupled to said control module to permit configuring of the predetermined range in said control module.

3. The system as claimed in claim 2, wherein the predetermined range is a resistance range, said control module obtaining the detected response through said input module and said analog-to-digital converting module, converting the detected response to a corresponding resistance value, and determining if the resistance value corresponding to the detected response falls within the resistance range.

4. The system as claimed in claim 1, wherein said indication interface is disposed for providing a visual indication of the inspection result.

5. A system for inspecting soldering spots in a batch of storage batteries, each of the soldering spots interconnecting electrically soldering lugs on an adjacent pair of electrode plates of one of the storage batteries in the batch, said system comprising:
- a housing;
- a power supply unit disposed in said housing for outputting test power signals to be applied across opposite end portions of the soldering spots, respectively; and
- an inspecting unit disposed in said housing and including
  - a plurality of pairs of first and second inspecting terminals adapted to be connected electrically and respectively to the soldering spots so as to detect responses of the soldering spots to application of the test power signals by said power supply unit,
  - a control module for generating inspection results corresponding to the detected responses,
  - a transmission interface coupled to said control module to permit transmission of the inspection results therethrough, and
  - a processing device coupled to said transmission interface and configured for storing, analyzing and computing the inspection results supplied from said transmission interface so as to obtain information of the batch of the storage batteries.

6. The system as claimed in claim 5, wherein:
said control module of said inspecting unit determines if each of the detected responses of the soldering spots as detected through said pairs of first and second inspecting terminals falls within a predetermined range configured in said control module, and generates an indication signal if any one of the detected responses falls outside the predetermined range; and
said inspecting unit further includes an indication interface coupled to said control module to output the indication signal.

7. A system for inspecting soldering spots in storage batteries on a battery inspection line, each of the soldering spots interconnecting electrically soldering lugs on an adjacent pair of electrode plates of one of the storage batteries on the battery inspection line, said system comprising:
- a housing;
- a power supply unit disposed in said housing for outputting test power signals to be applied across opposite end portions of the soldering spots, respectively; and
- an inspecting unit disposed in said housing and including
  - a plurality of pairs of first and second inspecting terminals adapted to be connected electrically and respectively to the soldering spots so as to detect responses of the soldering spots to application of the test power signals by said power supply unit,
  - a control module for generating a control signal based on the detected responses,
  - a control interface to permit transmission of the control signal generated by said control module therethrough, and
  - a peripheral device coupled to said control interface so as to receive the control signal therefrom and responsive to the control signal to move a defective one of said storage batteries associated with the control signal away from the battery inspection line.

8. The system as claimed in claim 7, wherein:
said control module of said inspecting unit determines if each of the detected responses of the soldering spots as detected through said pairs of first and second inspecting terminals falls within a predetermined range configured in said control module, and generates an indication signal if any one of the detected responses falls outside the predetermined range; and
said inspecting unit further includes an indication interface coupled to said control module to output the indication signal.

* * * * *